US005572410A

United States Patent [19]

Gustafson

[11] Patent Number: 5,572,410

[45] Date of Patent: Nov. 5, 1996

[54] INTEGRATED CIRCUIT DEVICE HAVING A WINDING CONNECTED TO AN INTEGRATED CIRCUIT SOLELY BY A WIRE

[76] Inventor: Ake Gustafson, Route Champ Thomas, 1618, Châtel-St-Denis, Switzerland

[21] Appl. No.: 94,027

[22] PCT Filed: Feb. 20, 1992

[86] PCT No.: PCT/EP92/00363

§ 371 Date: Jul. 26, 1993

§ 102(e) Date: Jul. 26, 1993

[87] PCT Pub. No.: WO92/15105

PCT Pub. Date: Sep. 3, 1992

[30] Foreign Application Priority Data

Feb. 25, 1991 [CH] Switzerland .......................... 00555/91

[51] Int. Cl.[6] ...................... H05K 7/02

[52] U.S. Cl. .......................... 361/807; 257/779; 257/784; 336/90

[58] Field of Search .................... 361/807, 748, 361/719–720, 728–730; 174/260–261, 259, 263, 52.1, 52.2; 336/90, 96; 257/779, 784

[56] References Cited

U.S. PATENT DOCUMENTS

| | | |
|---|---|---|
| 3,609,741 | 9/1971 | Miller . |
| 4,001,822 | 1/1977 | Sterzer . |
| 4,017,886 | 4/1977 | Tomono et al. . |
| 4,273,859 | 6/1981 | Mones et al. . |
| 4,507,852 | 4/1985 | Karulkar . |
| 4,805,232 | 2/1989 | Ma . |
| 4,857,893 | 8/1989 | Carroll . |
| 4,984,061 | 1/1991 | Matsumoto . |
| 4,990,993 | 2/1991 | Tsurumaru . |
| 4,992,794 | 2/1991 | Brouwers . |
| 5,025,550 | 6/1991 | Zirbes et al. . |
| 5,050,292 | 9/1991 | Zirbes et al. . |
| 5,136,271 | 8/1992 | Nishioka et al. . |
| 5,142,698 | 8/1992 | Koga et al. . |
| 5,261,615 | 11/1993 | Cuttelod . |
| 5,281,855 | 1/1994 | Hadden et al. . |

FOREIGN PATENT DOCUMENTS

| | | |
|---|---|---|
| 0252429 | 1/1988 | European Pat. Off. . |
| 0301127 | 2/1989 | European Pat. Off. . |
| 405671 | 1/1991 | European Pat. Off. . |
| 51-150914 | 12/1976 | Japan . |
| WO87/04900 | 8/1987 | WIPO . |
| WO92/22827 | 12/1992 | WIPO . |

OTHER PUBLICATIONS

"Metallurgical Considerations for Beam Tape Assembly", Solid State Technology, Mar. 1978.
"The reliability of Integrated Circuits protected with Ti–W/Au Bumps", Thin Solid Films, No. 160 (1988) pp. 113–120.
"Chambers Science and Technology Dictionary", W. R. Chambers Ltd. & Cambridge University Press, 1988.

*Primary Examiner*—Bot L. Ledynh
*Attorney, Agent, or Firm*—Oliff & Berridge

[57] ABSTRACT

The fixing process according to the invention of a winding to one or more electronic circuits permits elimination of an important manufacturing step of the processes according to the prior art, whether the positioning, then the gluing or the precise fixing of the winding or of the core to be wound on the electronic circuit or circuits. By a suitable arrangement of the electronic circuit or circuits and of the possible core, independently of one another, on a holding tool according to the invention, a semi-finished product is obtained, also according to the invention, made up of said circuit or circuits and said winding, the mechanical connection between them being ensured solely by the copper wires producing, moreover, the electrical connecting between the two elements. The finished component according to the invention will be obtained by disposing the preceding semi-finished product on a support ensuring a permanent mechanical connection between the two elements.

10 Claims, 6 Drawing Sheets

INTEGRATED CIRCUIT DEVICE HAVING A WINDING CONNECTED TO AN INTEGRATED CIRCUIT SOLELY BY A WIRE

The present invention relates to the making of electronic components of very small dimensions, and in particular to those including a winding connected to one or more electronic circuits, or more precisely to one or more chips or integrated circuits or printed circuits or discrete electronic elements. Electronic circuit will be spoken of hereafter in the description, it being well understood that each time it may have to do with one or the other of the elements mentioned above.

Certain problems are encountered at the time of making such components, caused mainly by the very small dimensions of the elements in question; indeed, the type of electronic circuit involved here has typical dimensions on the order of 1 mm×1 mm×0.5 mm and a typical mass on the order of 4 mg, whereas the coil core, for one of the embodiments considered, has a diameter on the order of 0.8 mm and a length of about 5 mm, and the copper wire used for winding has a typical diameter of 0.020 mm over enamelled insulation.

When producing such a component conventionally, it is necessary to fix the electronic circuit or circuits to the core before the winding of the latter, the fixing in position of one of these elements relative to the other having to be done with great precision so that the ends of the winding wires may be brought safely opposite the metal paths disposed on the electronic circuit in order to be soldered there, on an automatic winding machine. Such a component according to the prior art is described in the application EP-A-0.405.671, where it is seen that the circuit or circuits are first fixed to a specially shaped portion of the core.

The fixing process according to the invention proposes to get rid of this drawback by eliminating the intermediate step consisting in first fixing the core to be wound to the electronic circuit. The elimination of this delicate step greatly facilitates the production of such components by making it possible to avoid soiling the tool or the production machine with glue and, moreover, by making use of a tool manufactured with precision, permits doing away with the necessity of having precise positioning of the various elements before they are disposed on the winding tool.

A first object of the invention is therefore to propose a winding process by which, in particular, the electronic circuit or circuits are held independently of the winding, appropriate guide means guiding the winding wire so that it passes directly above metal paths of the electronic circuit or circuits. Another object of the invention is that the process may preferably be applied to an automatic winding machine provided with a "flyer"-type pay-out reel. Another object of the invention is that the preceding process may be applied to a winding carried out on a core as well as to a winding carried out on a false core, thus permitting an air-core coil to be obtained. Other objects of the invention are that the soldered joints of the wires on the circuits may take place along a plane parallel to the axis of the core, and that different possibilities may be envisaged for withdrawing the component from the machine after winding.

In order to achieve these different objects, the winding process according to the invention answers the characteristics of claims 1 to 7.

Another object of the invention is to propose a tool permitting the preceding process to be carried out, capable of holding the different electronic circuits and the winding independently of one another and comprising guide means capable of bringing the winding wire safely to the suitable locations for soldering and winding.

This object is obtained by a specially designed holding tool answering the characteristics of claims 8 to 11.

And finally, another object of the invention is to propose a component, comprising a winding and at least one electronic circuit, without any rigid mechanical connection between the winding and the electronic circuit or circuits, produced especially by the process and with the aid of the tool mentioned above, this component capable of being considered a semi-finished product and so answering the characteristics of claim 12 and being capable of then being terminated according to several embodiments in conformity with the characteristics of claims 13 to 24.

This invention is more particularly understandable starting from the appended drawing with the figures where:

FIG. 1 represents a top view of a first embodiment of a holding tool according to the invention, FIG. 2 represents a longitudinal section along the line II—II of the holding tool of the preceding figure, FIG. 3 represents a top view of another embodiment of a holding tool according to the invention, FIG. 4 represents a longitudinal section along the line IV—IV of the holding tool of the preceding figure, FIG. 5 represents still another embodiment of a holding tool according to the invention, FIG. 6 represents a component according to the invention in the form of a semi-finished product, and FIGS. 6A, 6B, 6C, 6D, and 6E represent other embodiments of a finished component.

Figure 1:
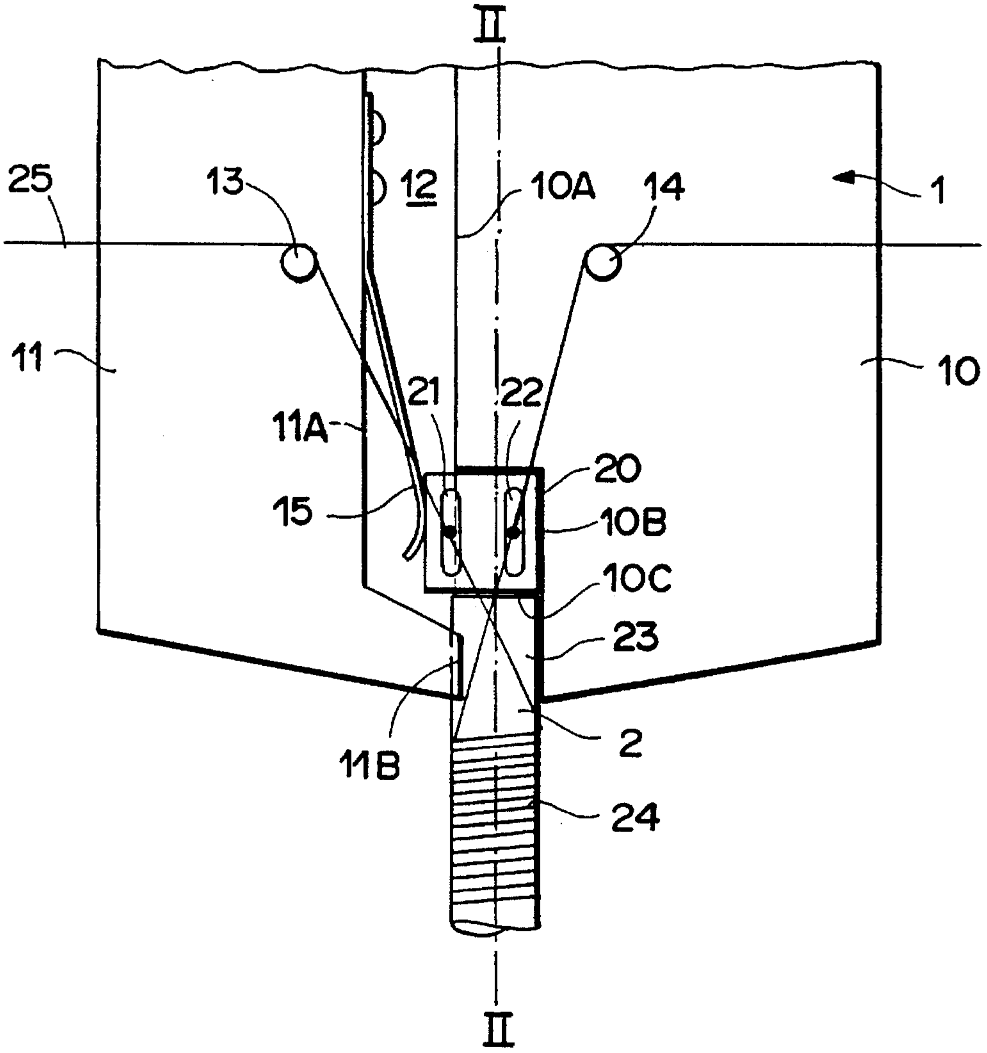
Figure 2:
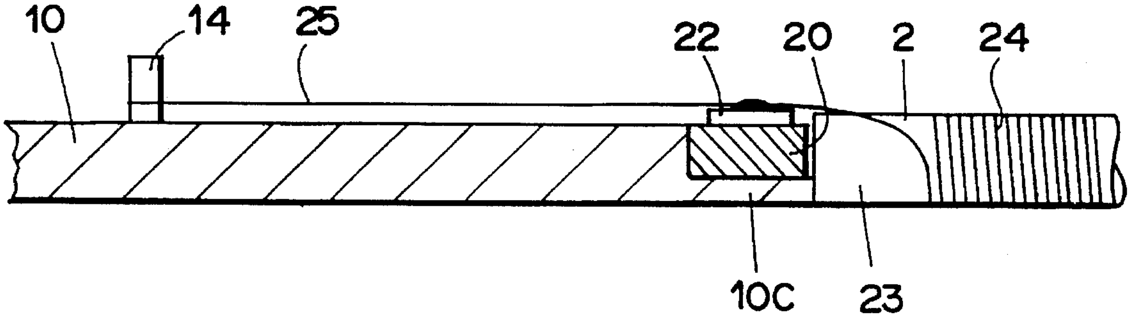

A holding tool 1, according to a first embodiment of the invention, is depicted in FIG. 1; it is rather similar to that described in patent application CH 552/91-9; it differs therefrom, which constitutes the invention, in the system of holding the electronic circuit and the core independently, as will be seen below. The tool 1 has a general clamp shape and comprises a first nose 10, generally a fixed nose, and a second nose 11, generally a movable nose, being able to move away from one another, preferably in parallel direction, or to move together leaving an intermediate space 12 between the two inside faces 10A and 11A of said noses, as well as guide means, here made up of two guide points 13 and 14, each of them being disposed on a rear portion of the upper face of the movable nose 11 and of the fixed nose 10, respectively. The holding tool 1 is intended to hold the component 2 made up of an electronic circuit 20, comprising two metal paths 21 and 22, and of a core 23 intended to receive the winding 24. To hold the circuit 20 and the core 23, the front end of the inside face 10A of the fixed nose 10 includes a cavity 10B, the rear part of which is not completely hollowed out but includes a support portion 10C in the prolongation of the lower part of the nose 10. The width of the cavity 10B is slightly less than the width of the electronic circuit 20 and approximately equal to the diameter of the core 23, whereas the thickness of the support portion 10C remaining in the rear part of said cavity is such that the upper face of the electronic circuit 20 is flush with the upper face of the nose 10 when said circuit is disposed on said support portion, as is visible in FIG. 2, which is a section along the axis II—II of the preceding figure. The electronic circuit 20 as well as the core 23 are disposed independently of one another in the tool 1, either manually or automatically, by suitable automatic loading devices.

It will be noticed that, in the two figures, the length of the support portion 10C is slightly less great than the length of the electronic circuit 20 when the latter rests against the rear face of the cavity 10B. The front face of the support portion 10C serves as a stop against which the end of the core 23 comes to rest. Thus, the core 23 is separated from the electronic circuit 20 by a small space corresponding to the difference between the length of the support portion 10C and the length of the electronic circuit 20, within the positioning tolerances. To hold the core 23 in position, the front end 11B of the movable nose 11 includes a concave cavity coming to rest against a cylindrical portion of the core 23, whereas the electronic circuit 20 is held at the back of the cavity 10B by a blade spring 15, the rearward end of which is fixed to the inside face 11A of the movable nose 11. The fact of holding the two elements 20 and 23 between the two noses of the tool independently of one another is novel and forms part of the invention.

The winding 24 is preferably produced with the aid of a "Flyer" (not shown). The winding wire 25 is brought by the "Flyer," which makes it pass behind the first guide point 13, then above the first metal path 21, in order to effect the winding 24 about the core 23, before withdrawing the wire above the second metal path 22 and behind the second guide point 14 to carry it away toward the following holding tool. Next, the two portions of wire situated directly above each of the metal paths 21 and 22 are soldered to said paths by an automatic soldering apparatus (not shown) which takes off the enameled insulation from the portion of wire in question at the same time as it undertakes the soldering. A transfer device (not shown) can now come to take the component 2, seizing it preferably by the core 23, or by the electronic circuit 20, and withdraw it from holding tool 1 after opening of the movable nose 11 and cutting or tearing of the wire ends before the soldering carried out on the metal path 21 and after that carried out on the metal path 22. Because of the relative positions of the two guide points 13 and 14, mutually and with the circuit 20, as shown in FIG. 1, the wire arriving to be wound and the one leaving after winding cross at a point situated between the circuit 20 and the winding 24; it would be just as possible to dispose these different elements in such a way that the crossing of the two wires is situated outside the component 2. The manner of producing the winding 24 described here corresponds to a preferred manner; certain variants in the way of using the "Flyer" may be found, particularly by assisting it with auxiliary fingers or guide hooks as need be.

Figure 3:
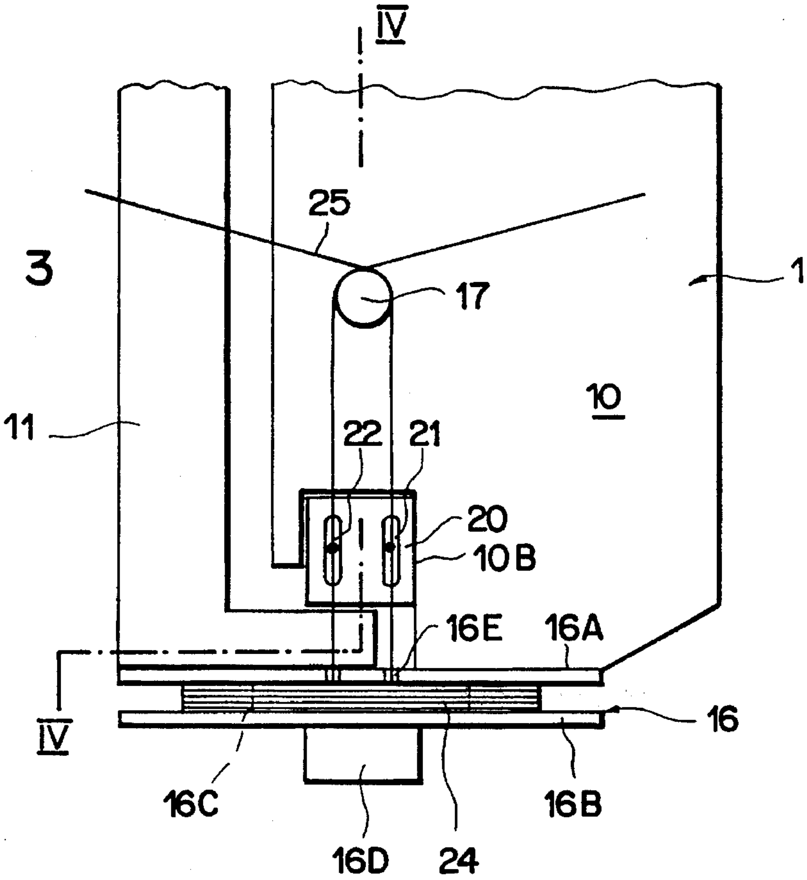
Figure 4:
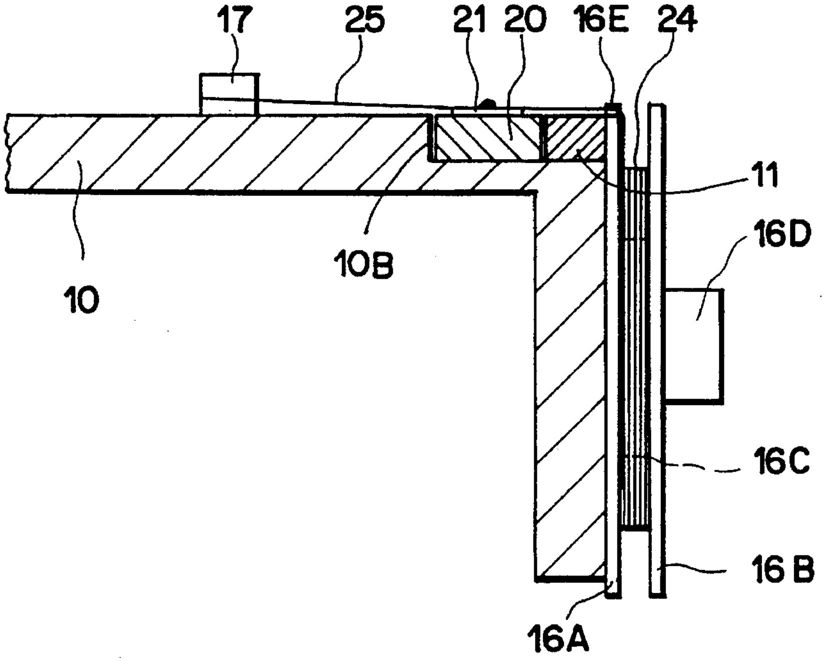

A second embodiment of a tool 1 according to the invention is depicted in FIGS. 3 and 4, where it is applied to the manufacture of an air-core winding to which an electronic circuit 20 is added. For this embodiment of the holding tool, the cavity 10B in which the circuit 20 is lodged holds said circuit on three side faces, while an extension of the movable nose 11 comes to hold the fourth side face. As is seen in FIG. 4, the thickness of the extension of the movable nose 11 coming to lean against the circuit 20 is approximately equal to that of the circuit, as a result of which the bottom of the circuit 20 can lean against a plane bottom part of the seat 10B. In this embodiment, the movable nose 11 serves only to hold the circuit 20 in its seat via its extension. In the case of the making of an air-core winding, i.e., without a core, it is necessary to have a false core as depicted, for example, at 16, made up of a first fixed flange 16A, fixed to the end of the nose 10, of a second movable flange 16B, of a bobbin 16C, not necessarily of circular cross-section, fixed either to the fixed flange 16A or to the fixed [sic] flange 16B, and of fixing means 16D permitting the movable flange 16B, as well as the bobbin 16C, to be made integral with the fixed flange 16A. Guide means 16E, for example one or more notches, may be disposed on a portion of the circumference of the fixed flange 16A in order to guide the winding wire 25. Preferably, the notch or notches 16E have a suitable shape, in principle three-dimensional, in order to guide the wire correctly and dependably at the time of its arrival on the winding and at the time of its withdrawal.

Besides the modifications mentioned above, the tool 1 further comprises another modification as compared with the first embodiment described earlier. One notices in the figure that instead of the two guide points 13 and 14 of FIG. 1, the tool 1 depicted here comprises only a single guide point 17 serving to guide the wire 25 both at the time of its arrival on the tool 1 and at the time of its leaving. In order that the guidance may be correct, and that the two portions of wire overhanging the metal paths 21 and 22 may be parallel, the diameter of the point 17 will preferably be equal to the space between axes between the two metal paths 21 and 22.

The winding operation is carried out similarly to what has been described previously, the wire 25 being brought onto the tool 1 behind the point 17, passing next above the metal path 21 of the circuit 20, then through the notch or the first notch 16E, next to be wound around the bobbin 16C, between the two flanges 16A and 16B, then to be withdrawn through the notch or the second notch 16E, to pass above the metal path 22, then behind the point 17. When the soldered joints are made on the metal paths 21 and 22, when means for gluing or fixing the turns of the winding 24 have been used in order to join the turns together and when the ends of the wires respectively disposed before the joint of the path 21 and after that of the path 22 have been torn off, it suffices to withdraw the movable flange 16B by acting upon the fixing means 16D, then to withdraw the assembly composed of the winding 24 to which the circuit 20 is fixed by means of the two winding wire ends soldered to the paths 21 and 22. These last operations may be carried out manually or by automatic means. It is then possible, by mechanical means or manually, to force the circuit 20 back into the same plane as the winding 24, possibly within the empty space disposed within the winding 24.

Figure 5:
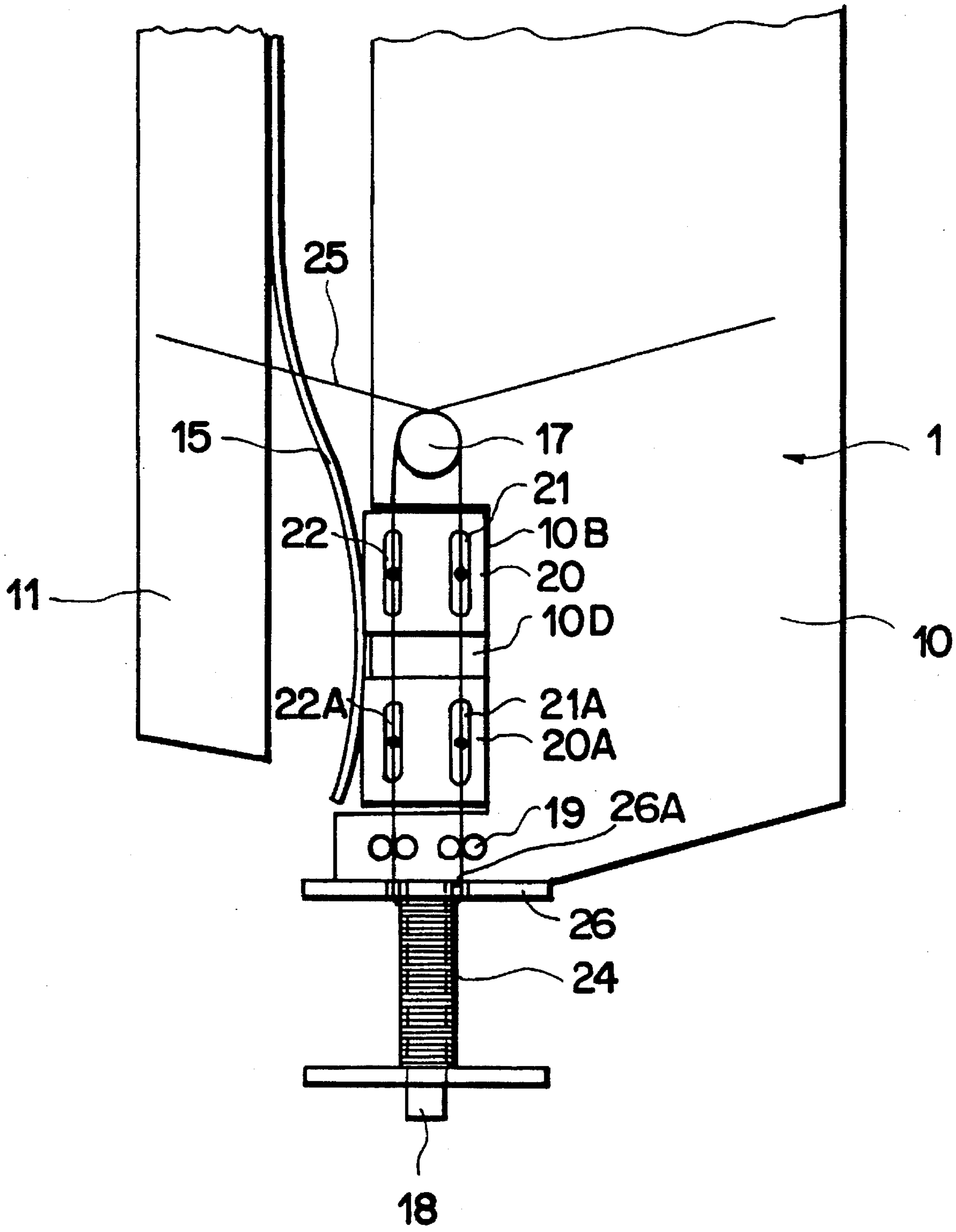

FIG. 5 shows still another embodiment of a tool 1, intended for disposing several circuits 20, 20A . . . simultaneously on a winding 24. In this case, the seat 10B provided in the fixed nose 10 is dimensioned for receiving several circuits, two in the case represented, disposed one behind the other on the principal longitudinal axis of the tool 1. Spacing means 10D, possibly retractable, may be provided in said seat so that a free space subsists between the circuits. It is an advantage of the embodiment of the tool 1 comprising only a single guide point 17 to have a portion of said tool above which the ends of the wires 25 entering and leaving the winding are disposed mutually parallel. When disposing several circuits 20, 20A, . . . on this tool portion, it is therefore easy to make the winding wire pass successively above several metal paths 21, 21A, . . . at the time of the intake of the wire, then once more over several paths 22, 22A, . . . at the time of its withdrawal.

The tool 1 is represented here to be used for producing a winding 24 on a core 26 comprising a core base and two flanges. This core 26 may be made of any material according to the use to be made of it, it may be of synthetic material, magnetic or not, rigid or flexible. Since the core base is preferably hollow, a tenon 18 may be provided on the end of the nose 10, disposed along the principal axis of the tool 1, and onto which it is possible to slip the core 26. Additional means for guiding the wire 25 in order to dispose it suitably on the core 26 may be provided, for example two or four possibly profiled points 19, disposed at the end of the nose 10 or one or two grooves 26A of suitable shape disposed on a portion of the flange of the core 26 in contact with the nose 10.

The way of carrying out the winding 24 and the soldered joints on the circuits is absolutely similar to what has been described previously.

Different embodiments of the holding tool have been described for the execution of different embodiments of windings. It is well understood that certain ones of the variants described are generally independent of one another and that it is possible to choose the one which is best adapted to the needs. For example, the ends of the fixed and movable noses of FIG. 1 are particularly adapted for small cylindrical cores, whereas the modes of fixing the coil by a tenon 18, as in FIG. 5, or by a false coil form 16, as in FIG. 3, depend essentially on the type of winding to be produced. Likewise, the embodiment according to which the guide means are composed of only a single point 17, as in FIG. 5, is particularly adapted to the cases where there is a component comprising more than one circuit 20. On the other hand, the mode of holding the circuit 20, with or without spring 15, may be chosen for any embodiment. The auxiliary guide means, points 19 and/or profiled grooves 16E or 26A, are chosen according to the needs.

It is thus seen that by the process and the tool according to the invention, it is possible to produce a component according to the invention made up of a winding of fine wire of any known type, connected to one or more electronic circuits, the characteristic common to all these components being that, at this stage of manufacture, the winding and the circuit or circuits are held together mechanically only by the connection wires which join them. This effect is possible solely owing to the very low mass of the electronic circuit and to the mechanical resistance of the connection wires, which is sufficient despite the very small diameter of said wires.

Another advantage of the process and of the tool according to the invention is that the operation of soldering the fine wire on the metal paths can take place in a plane parallel to the axis of the coil, generally in a horizontal plane; for the usual winding machines, this facilitates the soldering operation. However, there is nothing to prevent analogously disposing the circuit or circuits 20 along a vertical plane in case there is a machine carrying out the soldered joints along a vertical plane.

One or more electronic circuits 20, 20A, . . . are mentioned in the description; it may be a question, as mentioned above, either of a miniaturized complete integrated electronic circuit or else of a simple electronic element, as, for example, a capacitor or even of a miniature printed circuit. In case several circuits are assembled, there may be, for example, identical or different circuits or a circuit and an electronic element or even identical or different electronic elements. The characteristics common to these parts are a very small size and mass, as well as the fact that two metal contact paths are accessible on one face of each of said parts.

Figure 6:
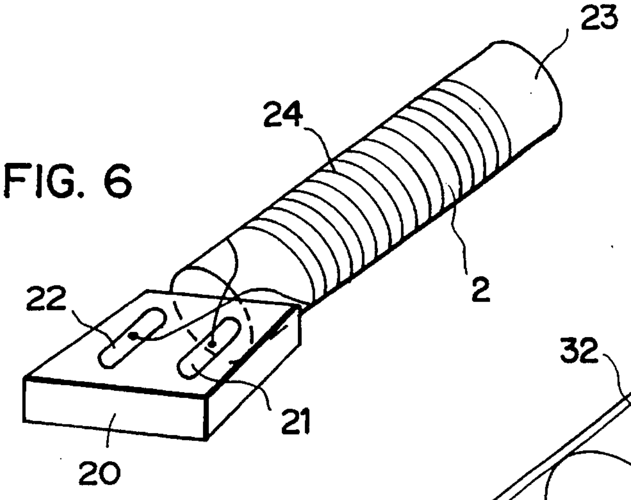

Generally, the components 2 made up of a winding connected to one or more circuits cannot be used as is but must be packaged. For example, the miniature winding 24 connected to the circuit 20, as depicted in FIG. 1, must be considered a semi-finished product, whether a component according to the invention as shown in FIG. 6, made up of a core 23 on which the winding 24 is produced, the two ends of the winding wires being soldered on the metal paths 21 and 22 of an electronic circuit 20. The only connection between the electronic circuit 20 and the core 23 is made via said ends of the winding wires which thus ensure both the electrical connection between the two elements and the mechanical connection between these same two elements. In view of the very low mass of the electronic circuit 20, the mechanical rigidity offered by the two connection wires is sufficient to support one or the other of said elements when the complete component is held by the other of said elements, the core 23 or the circuit 20. In view of the slight spacing provided between them at the time of the placing of the circuit 20 and of the core 23 on the tool 1, there exists no tensile stress on the wires due to a poor positioning of one of the elements relative to the other.

It is obvious that in such dimensions, the mechanical connection ensured by the connection-wires can be only a temporary connection and cannot be a permanent connection; it is nevertheless sufficient to make it possible to eliminate a first stage of fixing the electronic circuit 20 to the core 23, the elimination of said stage of the manufacturing process permitting a substantial saving of time and money.

Figure 6A:
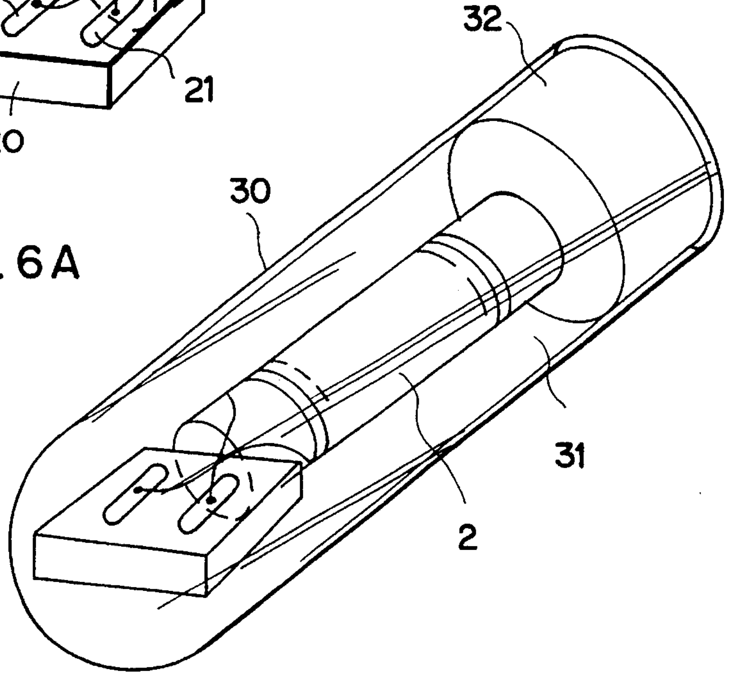
Figure 6B:
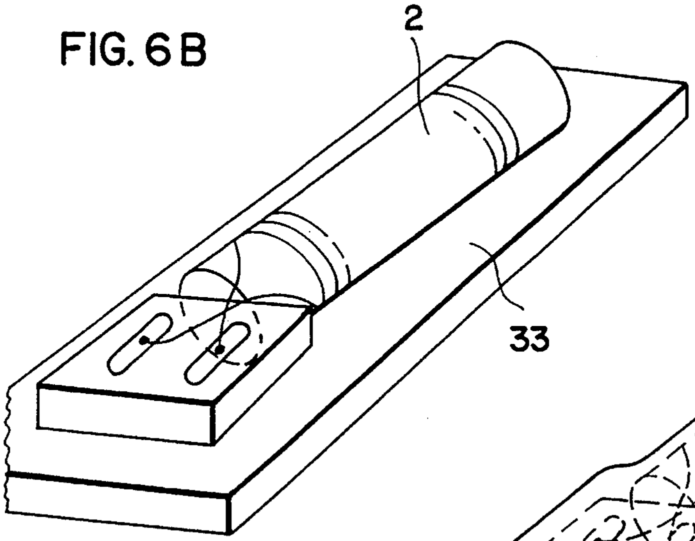
Figure 6C:
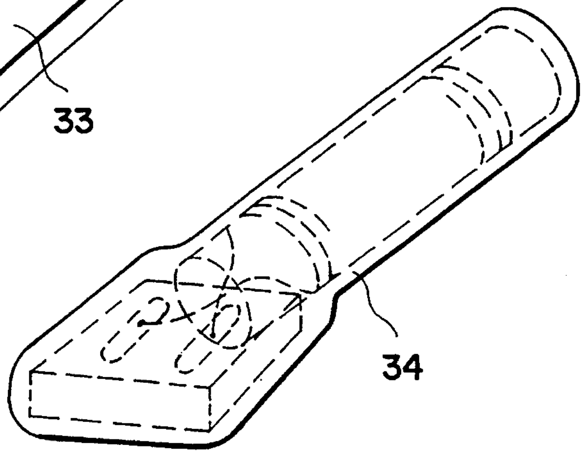
Figure 6D:
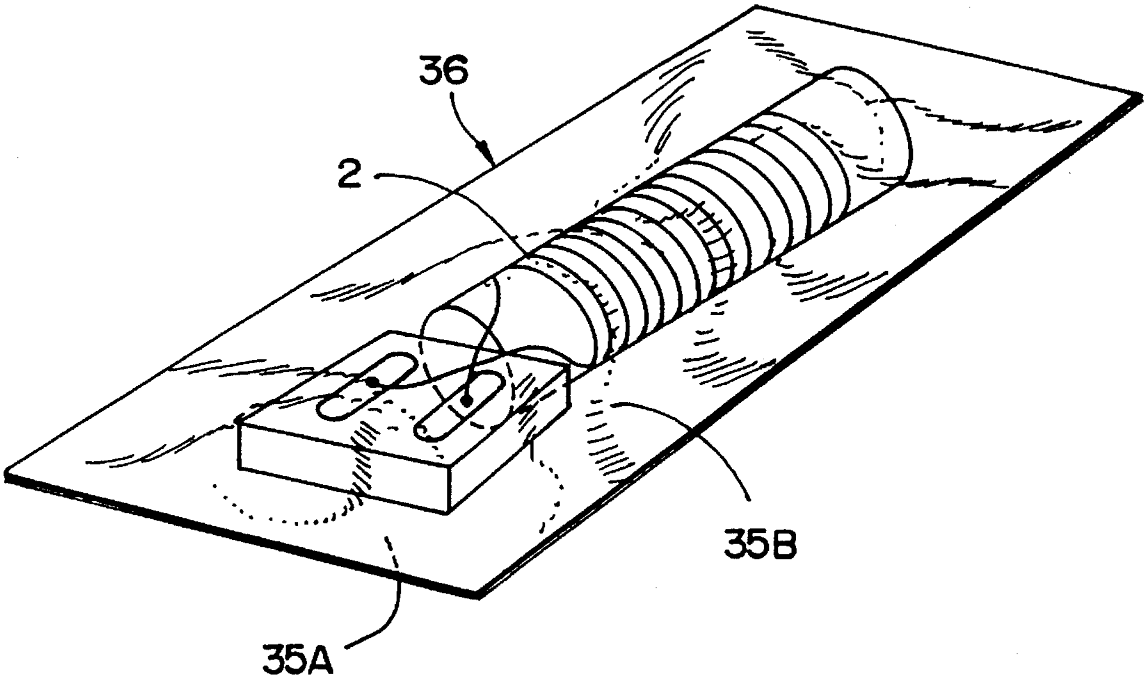

To finish the manufacture of the complete component according to the invention, it now suffices to encapsulate said component in order to protect it from mechanical shocks and from soiling, to ensure a durable mechanical connection between the two elements, and to give it a size allowing it to be handled better. Several possibilities exist for this purpose; in FIG. 6A the component has been introduced into a glass mini-tube 30 closed at one end, containing a certain quantity of a liquid 31 capable of hardening, for example by polymerization under the effect of an exposure to an UV radiation, or else a two-component liquid hardening when the two components are combined, in order to fix the two elements together and to the tube 30. The tube 30 is then hermetically sealed by fusion or by a sealing product 32. According to another embodiment of the finished product visible in FIG. 6B, the two elements of the component 2 are simply disposed on a rigid support 33 on which they are glued; they are made integral with one another via said rigid support. The assembly may or may not be covered, partially or completely, with a protective coating. According to a third embodiment visible in FIG. 6C, the component 2 is simply covered with an overlay coating 34 which ensures its mechanical hold. A fourth possible embodiment of the finished component is shown in FIG. 6D; in this case, the component has been placed between two independent portions 35A and 35B of a flexible sheet of synthetic material, the free edges 36 of said portions then being sealed together in any suitable manner, by thermal effect, by gluing, by crimping, etc. The envelope according to this embodiment may be contrived starting from a folded sheet in order to obtain the two portions 35A and 35B, only three free edges 36 being sealed, or else from two separate portions 35A and 35B of which the four free edges 36 are sealed, or even from a tube made up of a sheet rolled up and already closed along one generatrix, the two free edges 36 to be sealed being constituted by the ends of the tube. In order that the component cannot move between the two portions of sheets 35A and 35B, the sealing takes place as close as possible to the component, or else a vacuum is created between the two portions of sheets before sealing, so that the component is held firmly in its envelope. Even though the envelope-forming sheet is made up of a thin and flexible material, as a result of the small size of the component, or of its envelope, respectively, the component is held in its envelope in a sufficiently rigid manner.

Figure 6E:
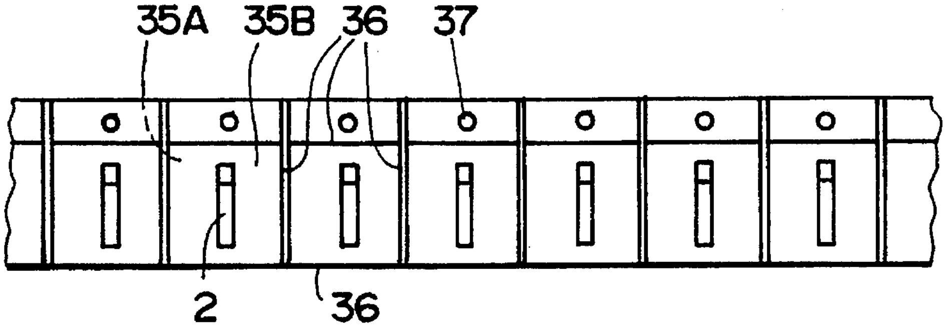

One advantage of this last embodiment of the envelope of a component is visible in FIG. 6E, where a plurality of components 2 assembled in a chain are seen. The components 2 are disposed side by side with a free space between them, between two flexible strips 35A and 35B, sealings 36, preferably welds, are made around the component in order to seal the component 2 within a fluid-tight envelope made up of two portions of the strips 35A and 35B connected by the sealings 36. Thus, the envelopment may take place by automatic means, the storage of the finished parts is facilitated thereby since it is easier to store a strip comprising a known number of elements rather than this same number of individual elements; it is very easy to obtain one or more individual finished elements since it then suffices to cut the strip, manually or by automatic means, between two consecutive welds situated in the space separating two components. Individual hooking or fixing means may easily be added to envelopes made up of thin sheets, for example one or more holes 37 contrived on one or more portions of the strip preferably disposed outside of the sealed part, thus permitting each component to be fixed to any other structure.

Figure 7:
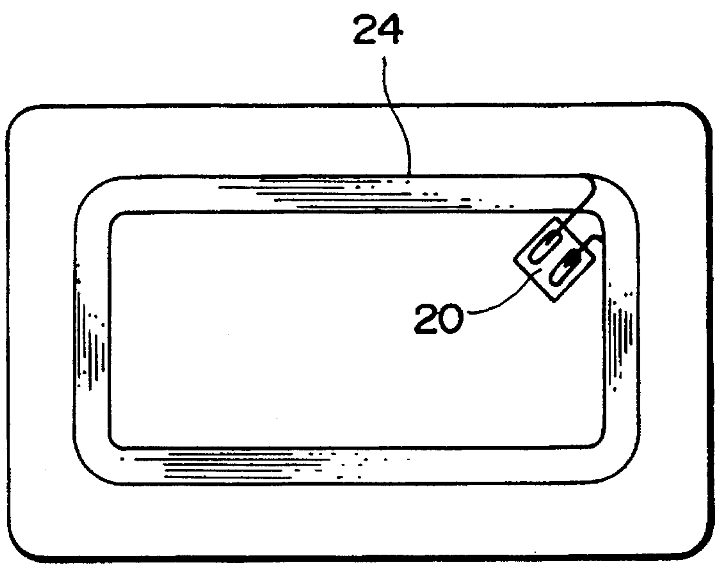
FIG. 7 represents another embodiment of a finished component.

As concerns the other winding embodiments described, the means of making the component rigid will be adapted to the type of coil and to its use; they will generally be less critical than for the first embodiment seen above, owing to the larger size of the coil. For example, for the air-core coil obtained by the tool of FIGS. 3 and 4, which might be intended to be inserted in an envelope in the shape and size of a credit card, the electronic circuit or circuits will first of all be forced back into the plane of the winding, possibly within the free space within the winding, manually or by mechanical means, by passage in a guiding slide of appropriate shape, or by an air jet, then the whole will be covered between two synthetic sheets, preferably semi-rigid or rigid, as is seen in FIG. 7 where the upper covering sheet is taken away in order to distinguish the positioning of the component.

Figure 8:
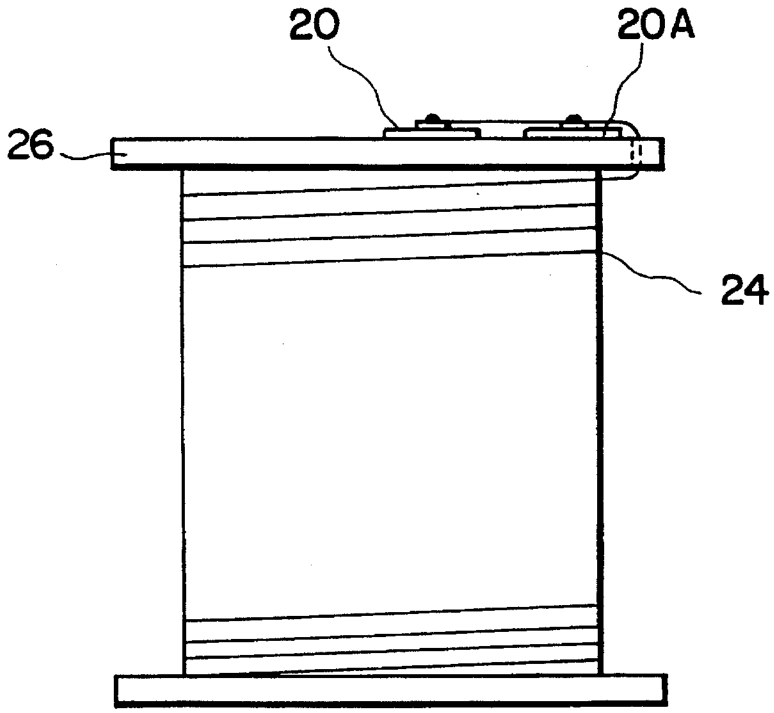
FIG. 8 represents still another embodiment of a finished component.

For the semi-finished product manufactured by the tool according to FIG. 5, it generally suffices as previously to fold up the connection wires in order to bring the circuit or circuits 20, 20A . . . into a plane parallel to the flange of the coil 26 as depicted in FIG. 8. According to the needs, it is thereafter possible to fix the circuit or circuits to said flange, by gluing for example. If the coil core comprises an accommodation of sufficient size, it is also possible to press the circuit or circuits back there and possibly to glue them there in order to ensure their mechanical protection.

As is seen in all the figures, the relative position of the electronic circuit 20 and the coil 24 is not important, the play between these two elements being limited only by the available length of the connection wires. Later, this component will form part of a larger electronic circuit, its excitation being ensured by electromagnetic field.

Diverse variants of the products mentioned above may be envisaged; in particular, it is not absolutely necessary for the elements to have the dimensions and masses mentioned; it suffices, to answer the characteristics of the invention, that the mechanical hold which can be offered by the connection wires be sufficient to ensure a temporary mechanical connection between elements, the dimensions and masses of which may be appreciably greater than indicated. Furthermore, as indicated previously, the electronic circuit in question may take different forms; it may also concern an integrated circuit, a simple discrete electronic component, or a printed circuit. Moreover, only a few possibilities of finishing the component have been described, it is well understood that said component may be finished in many other ways according to the needs.

Thus, by the process and the holding tool according to the invention, it is possible to obtain a semi-finished product and a finished product according to the invention, having the same operating qualities as those of the prior art, but the manufacture of which is appreciably simplified to the extent that soiling due to the glue on the tool or the machine is avoided, and that moreover it is no longer necessary to carry out an operation of assembling two or more elements necessitating great precision, said precision being transferred to the making of the tool according to the invention.

I claim:

1. A component produced particularly in the course of a process for producing a winding and for fixing said winding to at least one electronic circuit, the process comprising the steps of:

placing at least one electronic circuit, each electronic circuit comprising a body having a surface and a plurality of leadless accessible metal contact regions formed on or within the surface, on a holding tool;

bringing a winding wire on a first side of guide means disposed on one face of said holding tool, then above a first one of the plurality of leadless metal contact regions of the at least one electronic circuit;

producing the winding with said winding wire;

withdrawing the winding wire above a second one of the plurality of leadless metal contact regions of the at least one electronic circuit, then by a second side of said guide means;

electrically connecting each portion of the winding wire situated directly above each of said first and second ones of the plurality of leadless metal contact regions directly to the corresponding metal contact region; and opening the tool and withdrawing the component made up of said at least one electronic circuit connected to the winding solely by the two winding end wires electrically connected on the two leadless metal contact regions of said at least one electronic circuit;

wherein the at least one electronic circuit and the winding are electrically and mechanically connected only by the ends of the winding wires being directly electrically connected to the leadless metal contact regions of said at least one electronic circuit without leads being connected between the ends of the winding wires and the leadless metal contact regions; and wherein the at least one electronic circuit is not mechanically fixed to a core.

2. The component according to claim 1,wherein the component is subsequently inserted into a glass tube to be sealed therein.

3. The component according to claim 1, wherein the at least one electronic circuit is positioned in a plane of the winding.

4. The component according to claim 1, wherein the at least one electronic circuit is positioned in a space disposed within the winding.

5. An electronic component, comprising:

at least one electronic circuit, each at least one electronic circuit comprising:

a body having a surface, and a plurality of leadless metal contact regions formed on or within the surface and contained entirely within lateral bounds of the body; and a winding comprising a conductive wire;

wherein the at least one electronic circuit and the winding are electrically and mechanically connected solely by ends of the conductive wire being directly electrically connected to the leadless metal contact regions of each of said at least one electronic circuit without leads being connected between the ends of the winding wires and the leadless metal contact regions and without mechanically fixing the at least one electronic circuit to a core.

6. The component according to claim 5, wherein the component is subsequently inserted into a glass tube to be sealed therein.

7. The component according to claim 5, wherein the at least one electronic circuit is positioned in a plane of the winding.

8. The component according to claim 5, wherein the at least one electronic circuit is positioned in a space disposed within the winding.

9. An integrated circuit device, comprising:

at least one integrated circuit, each at least one integrated circuit comprising:

a body having a surface, and a plurality of metal contact regions formed on or within the surface and contained entirely within lateral bounds of the body; and a winding comprising a conductive wire;

wherein the at least one integrated circuit and the winding are electrically and mechanically connected solely by ends of the conductive wire being electrically connected to the metal contact regions of each of said at least one integrated circuit.

10. A miniature integrated circuit device excitable by an electromagnetic field, comprising:

at least one integrated circuit, each at least one integrated circuit comprising:

a body having a surface, and a plurality of metal contact regions formed on or within the surface and contained entirely within lateral bounds of the body; and a winding comprising a conductive wire;

wherein the at least one integrated circuit and the winding are electrically and mechanically connected solely by ends of the conductive wire being electrically connected to the metal contact regions of each of said at least one integrated circuit.

* * * * *